(12) United States Patent
Koyama et al.

(10) Patent No.: US 11,749,493 B2
(45) Date of Patent: Sep. 5, 2023

(54) LIQUID METAL ION SOURCE AND FOCUSED ION BEAM APPARATUS

(71) Applicant: HITACHI HIGH-TECH SCIENCE CORPORATION, Tokyo (JP)

(72) Inventors: Yoshihiro Koyama, Tokyo (JP); Tatsuya Asahata, Tokyo (JP); Masahiro Kiyohara, Tokyo (JP); Tsunghan Yang, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 347 days.

(21) Appl. No.: 17/027,291

(22) Filed: Sep. 21, 2020

(65) Prior Publication Data

US 2021/0090842 A1 Mar. 25, 2021

(30) Foreign Application Priority Data

Sep. 24, 2019 (JP) .................................. 2019-172506

(51) Int. Cl.
*H01J 37/08* (2006.01)
*H01J 37/09* (2006.01)

(52) U.S. Cl.
CPC .............. *H01J 37/08* (2013.01); *H01J 37/09* (2013.01); *H01J 2237/0805* (2013.01); *H01J 2237/31749* (2013.01)

(58) Field of Classification Search
CPC .......... H01J 37/08; H01J 37/09; H01J 37/073; H01J 37/21; H01J 37/28; H01J 37/252; H01J 37/261; H01J 37/3002; H01J 37/3053; H01J 2237/0213; H01J 2237/0805; H01J 2237/31749
See application file for complete search history.

(56) References Cited

U.S. PATENT DOCUMENTS

| 5,539,274 A * | 7/1996 | Araki ................. H01J 37/3233 313/231.31 |
| 8,460,842 B2 * | 6/2013 | Ogawa ................. B82Y 10/00 430/5 |
| 2008/0315122 A1* | 12/2008 | Katagiri .............. H01J 37/3056 250/492.1 |

(Continued)

FOREIGN PATENT DOCUMENTS

| JP | 1986-022537 A | 1/1986 |
| JP | 1995-153403 A | 6/1995 |

*Primary Examiner* — Tung X Le
(74) *Attorney, Agent, or Firm* — Holland & Hart LLP

(57) ABSTRACT

A liquid metal ion source (50) includes: a reservoir (10) configured to hold an ion material (M) forming a liquid metal; a needle electrode (20); an extraction electrode (22) configured to cause an ion of the ion material to be emitted from a distal end of the needle electrode; a beam diaphragm (24), which is arranged on a downstream side of the extraction electrode, and is configured to limit a beam diameter of the ion; and a vacuum chamber (30) configured to accommodate and hold the reservoir, the needle electrode, the extraction electrode, and the beam diaphragm in vacuum, wherein the liquid metal ion source further includes an oxidizing gas introducing portion (40), and wherein the oxidizing gas introducing portion communicates to the vacuum chamber, and is configured to introduce an oxidizing gas into a periphery of the needle electrode.

10 Claims, 4 Drawing Sheets

(56) References Cited

U.S. PATENT DOCUMENTS

| | | | |
|---|---|---|---|
| 2010/0320942 A1* | 12/2010 | Hayn | H01J 37/063 |
| | | | 315/379 |
| 2017/0309437 A1* | 10/2017 | Agemura | H01J 37/18 |
| 2018/0012726 A1* | 1/2018 | Shichi | H01J 37/28 |
| 2021/0142999 A1* | 5/2021 | Kudo | H01J 49/068 |
| 2022/0115225 A1* | 4/2022 | Takahashi | H01J 49/0422 |

\* cited by examiner

| VACUUM DEGREE [Pa] | STABILITY OF EMISSION OF ION BEAM |
|---|---|
| $2.0 \times 10^{-6}$ | × |
| $5.0 \times 10^{-6}$ | ○ |
| $8.0 \times 10^{-6}$ | ○ |
| $1.0 \times 10^{-5}$ | ○ |
| $1.5 \times 10^{-5}$ | ○ |
| $2.0 \times 10^{-5}$ | × |

FIG. 6

| VACUUM DEGREE [Pa] | STABILITY OF EMISSION OF ION BEAM |
|---|---|
| $2 \times 10^{-6}$ | × |
| $5 \times 10^{-6}$ | × |
| $7.5 \times 10^{-6}$ | × |
| $1 \times 10^{-5}$ | ○ |
| $1.25 \times 10^{-5}$ | ○ |
| $1.5 \times 10^{-5}$ | ○ |
| $3.0 \times 10^{-5}$ | ○ |
| $5.0 \times 10^{-5}$ | × |

FIG. 7

LIQUID METAL ION SOURCE AND FOCUSED ION BEAM APPARATUS

CROSS REFERENCE TO RELATED APPLICATION(S)

This application claims the benefit of Japanese Patent Application No. 2019-172506, filed Sep. 24, 2019, which is hereby incorporated by reference in their entirety into this application.

BACKGROUND OF THE INVENTION

1. Field of the Invention

The present invention relates to a liquid metal ion source that can be suitably used, for example, as an ion source for a focused ion beam apparatus, and to a focused ion beam apparatus.

2. Description of the Related Art

A liquid metal ion source has hitherto been used as an ion source for a focused ion beam (FIB) apparatus.

The liquid metal ion source is configured to heat a liquid metal to wet a needle electrode, apply a voltage between the needle electrode and an extraction electrode to form the liquid metal at a distal end of the needle electrode into a cone shape called a Taylor cone, and emit ions from the distal end of the cone through field evaporation that occurs from the distal end.

However, a molten metal is oxidized to destabilize the emission of ions in some cases. In view of the foregoing, there have been reported a technology for introducing a reducing gas into the vicinity of a needle electrode (Japanese Patent Application Laid-open No. Sho 61-22537) and a technology for irradiating a liquid metal at a distal end of a needle electrode with ions (Japanese Patent Application Laid-open No. Hei 7-153403).

Incidentally, in order to suppress the spread of an ion beam and the contamination of a focusing lens, a beam diaphragm configured to limit an ion beam diameter is arranged on a downstream side of the extraction electrode in some cases.

However, there is a problem in that the beam diaphragm is irradiated with the ions to cause a sputtering phenomenon, and high-melting point materials, such as tungsten and molybdenum, forming the beam diaphragm fly as sputtering particles to adhere to the needle electrode. This adhering substance is aggregated at the distal end of the needle electrode by joining a flow of the liquid metal to inhibit the flow of the liquid metal, to thereby destabilize the emission of an ion beam.

Even when heating and flushing for temporarily increasing the emission amount of an ion beam are performed as countermeasures against the above-mentioned problem, the effects thereof have been limited.

SUMMARY OF THE INVENTION

The present invention has been made in view of the above-mentioned circumstances.

According to at least one embodiment of the present invention, there is provided a liquid metal ion source, including: a reservoir configured to hold an ion material forming a liquid metal; a needle electrode having a surface to be covered with the ion material supplied from the reservoir; an extraction electrode configured to cause an ion of the ion material to be emitted from a distal end of the needle electrode; a beam diaphragm, which is arranged on a downstream side of the extraction electrode, and is configured to limit a beam diameter of the ion; and a vacuum chamber configured to accommodate and hold the reservoir, the needle electrode, the extraction electrode, and the beam diaphragm in vacuum, wherein the liquid metal ion source further includes an oxidizing gas introducing portion, and wherein the oxidizing gas introducing portion communicates to the vacuum chamber, and is configured to introduce an oxidizing gas into a periphery of the needle electrode.

With this liquid metal ion source, when the oxidizing gas is introduced into the periphery of the needle electrode, the liquid metal on the surface of the needle electrode is actively oxidized to form an oxide film on an outermost surface. Then, sputtering particles from the beam diaphragm, which have flown onto the needle electrode, are trapped by the oxide film without reaching an inside molten body. Therefore, it is considered that the sputtering particles do not inhibit the flow of the molten body moving toward the distal end of the needle electrode. As a result, the emission of an ion beam becomes stable.

In the liquid metal ion source according to at least one embodiment of the present invention, the oxidizing gas is desirably water vapor.

Water has higher oxidizing ability than oxygen, and efficiently causes an oxidation reaction by becoming water vapor.

The liquid metal ion source according to at least one embodiment of the present invention may further include a final exhaust system configured to evacuate the vacuum chamber to a target vacuum degree, wherein the final exhaust system and the oxidizing gas introducing portion communicate to the vacuum chamber through separate flow passages.

With this liquid metal ion source, the oxidizing gas flows from the oxidizing gas introducing portion to the final exhaust system by making the flow passage of the final exhaust system different from that of the oxidizing gas introducing portion. Therefore, even when the flow rate of the oxidizing gas is small, efficient progress of the oxidation reaction can be achieved.

The liquid metal ion source according to at least one embodiment of the present invention may further include a final exhaust system configured to evacuate the vacuum chamber to a target vacuum degree, wherein the final exhaust system and the oxidizing gas introducing portion communicate to the vacuum chamber through the same flow passage.

With this liquid metal ion source, it is not required to provide a flow passage for the oxidizing gas introducing portion. Therefore, there is an advantage in that, when the oxidizing gas introducing portion is to be installed later in the existing liquid metal ion source, the degree of freedom for the installation is increased.

In the liquid metal ion source according to at least one embodiment of the present invention, the vacuum chamber in a state of having the oxidizing gas introduced thereinto may have a vacuum degree of from $5.0 \times 10^{-6}$ Pa to $1.5 \times 10^{-5}$ Pa.

In the liquid metal ion source according to at least one embodiment of the present invention, the vacuum chamber in a state of having the oxidizing gas introduced thereinto may have a vacuum degree of from $1.0 \times 10^{-5}$ Pa to $3.0 \times 10^{-5}$ Pa.

In the liquid metal ion source according to at least one embodiment of the present invention, at least part of the flow passage of the final exhaust system and at least part of the flow passage of the oxidizing gas introducing portion may be opposed to each other in a direction perpendicular to an irradiation direction of a beam of the ion.

With this liquid metal ion source, both the flow passages overlap with each other in the direction perpendicular to the irradiation direction of the beam of the ion. Therefore, the oxidizing gas easily flows from the oxidizing gas introducing portion to the final exhaust system.

In the liquid metal ion source according to at least one embodiment of the present invention, at least part of the flow passage of the final exhaust system and at least part of the flow passage of the oxidizing gas introducing portion may each be opposed to the needle electrode in a direction perpendicular to an irradiation direction of a beam of the ion.

With this liquid metal ion source, the oxidizing gas easily flows from the oxidizing gas introducing portion to the needle electrode.

The liquid metal ion source according to at least one embodiment of the present invention may further include an oxidizing gas introduction control unit configured to introduce the oxidizing gas into the vacuum chamber only when a voltage is applied between the needle electrode and the extraction electrode.

With this liquid metal ion source, the oxidizing gas is introduced only when the voltage is applied to emit an ion beam. Therefore, the waste caused by introducing the oxidizing gas under no application of a voltage, in which there is no effect of the oxidizing gas, can be suppressed.

According to at least one embodiment of the present invention, there is provided a focused ion beam apparatus, including the above-mentioned liquid metal ion source.

BRIEF DESCRIPTION OF THE DRAWINGS

FIG. 6 is a diagram showing a relationship between the introduction amount of the oxidizing gas and the stability of the emission of an ion beam in the liquid metal ion source according to the first embodiment.

FIG. 7 is a diagram showing a relationship between the introduction amount of the oxidizing gas and the stability of the emission of an ion beam in the liquid metal ion source according to the second embodiment.

DESCRIPTION OF THE EMBODIMENTS

Now, embodiments of the present invention are described with reference to the drawings.

Figure 1:
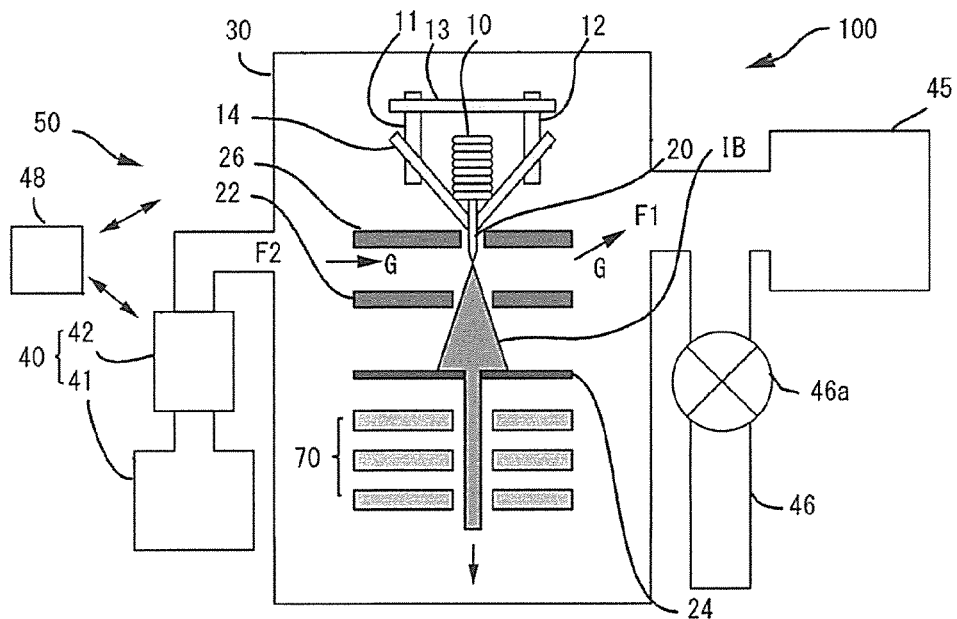
FIG. 1 is a diagram for illustrating an overall configuration of a focused ion beam apparatus including a liquid metal ion source according to a first embodiment of the present invention.

FIG. 1 is a block diagram for illustrating an overall configuration of a focused ion beam apparatus 100 including a liquid metal ion source 50 according to a first embodiment of the present invention.

In FIG. 1, the liquid metal ion source 50 includes a reservoir 10 configured to hold an ion material (Ga, etc.) forming a liquid metal, a needle electrode 20, an extraction electrode 22, a beam diaphragm 24, and a vacuum chamber 30 configured to accommodate and hold the reservoir 10, the needle electrode 20, the extraction electrode 22, and the beam diaphragm 24 in vacuum.

The reservoir 10 includes an internal space in which one end side of one wire is wound in a coil shape (trailing end side of FIG. 1), and includes the needle electrode 20, which is sharp-pointed, on the other end side (distal end side of FIG. 1). A filament heater 14 is obtained by processing one linear heater into a V-shape in side view, and a distal end part of the V-shape is connected to the vicinity of a portion of the wire wound in a coil shape.

Both end portions on a trailing end side of the filament heater 14 are electrically connected to a pair of electrode terminals 11 and 12. Through energization of the electrode terminals 11 and 12, the ion material in the form of the liquid metal retained in the reservoir 10 is heated with the filament heater 14, and the viscosity of a molten substance is decreased. Then, the liquid metal flows to the needle electrode 20 to cover a surface thereof. The electrode terminals 11 and 12 are supported by a support portion 13 made of an insulator.

When a voltage is applied to the extraction electrode 22 on a downstream side of the needle electrode 20, the liquid metal forms a cone shape called a Taylor cone due to the surface tension of the molten ion material (liquid metal) at a distal end of the needle electrode 20 and the attraction force of an electric field formed by the application of the voltage to the extraction electrode 22. Then, field evaporation occurs from the distal end of the cone to cause an ion beam IB to be emitted. The emitted ions are accelerated by the electric field formed by the needle electrode 20 and the extraction electrode 22, and proceed to a focusing lens 70 described below.

The beam diaphragm 24 is arranged on a downstream side of the extraction electrode 22, and is configured to limit an ion beam diameter. With this, the spread of the ion beam and the contamination of the focusing lens 70 can be suppressed.

When a suppressor electrode (suppression electrode) 26 is arranged between the needle electrode 20 and the extraction electrode 22, the emission amount of the ion beam can be controlled with a voltage applied to the suppressor electrode 26. When the ion beam is easily emitted, the ion beam is suppressed by increasing the voltage. When the ion beam is difficult to emit, the emission of the ion beam is accelerated by decreasing the voltage.

The reservoir 10, the needle electrode 20, the extraction electrode 22, and the beam diaphragm 24, which form the liquid metal ion source 50, are accommodated in the vacuum chamber 30 and held therein in vacuum.

In addition, the focused ion beam apparatus 100 according to the first embodiment of the present invention includes the focusing lens 70 configured to focus the ion beam IB narrowed by the beam diaphragm 24 on a downstream side of the beam diaphragm 24 in addition to the constituent elements of the liquid metal ion source 50. The focusing lens 70 is also accommodated in the vacuum chamber 30 and held therein in vacuum.

Further, an oxidizing gas introducing portion 40 configured to introduce an oxidizing gas into the periphery of the needle electrode 20 communicates to the vacuum chamber 30, and an ion pump 45 and an exhaust system 46 configured to hold the vacuum chamber 30 in vacuum also communicate to the vacuum chamber 30.

The exhaust system 46 is connected to the vacuum chamber 30 through a valve 46a, and is configured to evacuate the vacuum chamber 30 to a general (low) vacuum degree until the ion pump (final exhaust system) 45 is operated. Specifically, after the exhaust system 46 evacuates the vacuum chamber 30 to a vacuum degree at which the ion pump 45 is operated, the valve 46a is closed after the ion pump 45 is operated for a while, and the ion pump 45 is continued to be operated. With this, the vacuum chamber 30 is evacuated to a higher target vacuum degree by the ion pump 45. A flow passage of the exhaust system 46 and a flow passage of the ion pump 45 are joined to communicate to the vacuum chamber 30 through one flow passage F1.

In the first embodiment, the oxidizing gas introducing portion 40 communicates to the vacuum chamber 30 through another flow passage F2 at a position where at least part thereof is opposed to the flow passage F1 of the exhaust system 46 and the ion pump 45 in a horizontal direction (direction perpendicular to the irradiation direction of the ion beam IB). In addition, the flow passages F1 and F2 are formed at positions where at least part of the flow passage F1 and at least part of the flow passage F2 are opposed to the needle electrode 20 in the horizontal direction.

In addition, as illustrated in FIG. 1, in the first embodiment, an oxidizing gas G introduced into the vacuum chamber 30 through the flow passage F2 from the oxidizing gas introducing portion 40 passes through the needle electrode 20, and is discharged from the other flow passage F1 by the ion pump 45.

Thus, the oxidizing gas G flows from the flow passage F2 to the flow passage F1 by making the flow passage F1 different from the flow passage F2. Therefore, even when the flow rate of the oxidizing gas G is small, efficient progress of an oxidation reaction can be achieved.

In this example, the oxidizing gas introducing portion 40 includes a cylinder 41 configured to retain the oxidizing gas and a flow rate adjusting portion 42 configured to limit the flow rate of the oxidizing gas, and is configured to introduce the oxidizing gas in the cylinder 41 to the periphery of the needle electrode 20 of the vacuum chamber 30 through the flow rate adjusting portion 42.

As a material for the oxidizing gas, there are given, for example, water, oxygen, ozone, nitrous oxide, nitrogen monoxide, and nitrogen dioxide, and the material may be a liquid. In the case where the material is a liquid, two phases including vapor (at a vapor pressure in accordance with the temperature of the cylinder 41) and a liquid of the oxidizing gas are present in the cylinder 41, and the vapor (for example, water vapor) is supplied. In addition, a hydrate that holds water in a crystal, such as copper nitrate, copper sulfate, or iron iodide, may be used. Water has higher oxidizing ability than oxygen, and efficiently causes the oxidation reaction.

As the flow rate adjusting portion 42, a variable valve, an orifice, a mass flow controller, a material permeable to an oxidizing gas, or the like may be used. In addition, the supply flow rate may also be subjected to feedback control in accordance with the vacuum degree of the vacuum chamber 30 through use of a control valve.

Next, the reason for introducing the oxidizing gas into the periphery of the needle electrode 20 in the vacuum chamber 30, which is a feature of the present invention, is described with reference to FIG. 2 to FIG. 4.

Figure 2:
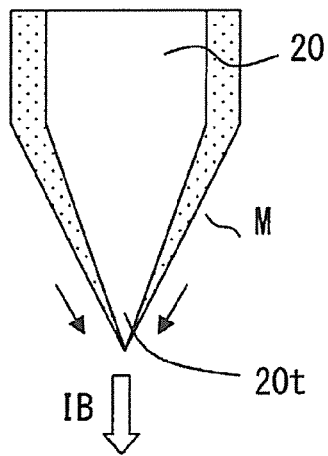
FIG. 2 is a schematic view for illustrating an ordinary state in which an ion beam is emitted from a needle electrode.

First, as illustrated in FIG. 2, in general, a molten body M of the ion material covering the surface of the needle electrode 20 flows to a distal end 20t of the needle electrode 20 to be emitted as the ion beam IB.

Figure 3:
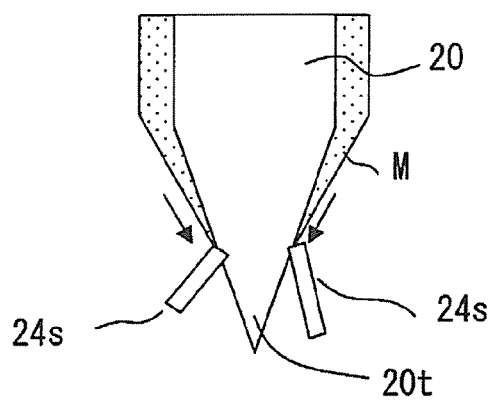
FIG. 3 is a schematic view for illustrating a state in which the ion beam is emitted from the needle electrode when a material for a beam diaphragm is sputtered.

However, when the beam diaphragm 24 is sputtered with the ion beam IB, a material for the beam diaphragm 24 adheres to the needle electrode 20 as sputtering particles 24s as illustrated in FIG. 3. The sputtering particles 24s are aggregated at the distal end 20t of the needle electrode 20 by joining a flow of the molten body M to inhibit the flow of the molten body M, to thereby destabilize the emission of the ion beam IB.

Figure 4:
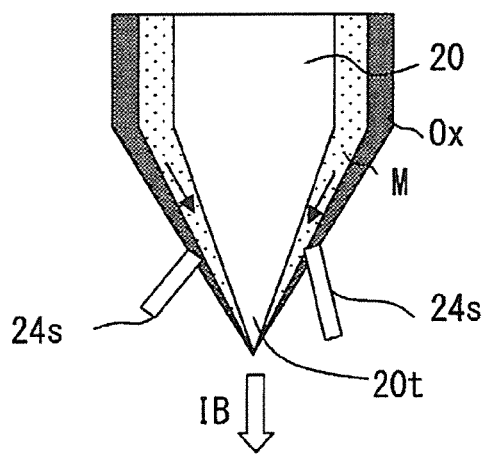
FIG. 4 is a schematic view for illustrating a state in which the ion beam is emitted from the needle electrode when an oxidizing gas is introduced into a periphery of the needle electrode.

In view of the foregoing, when the oxidizing gas is introduced into the periphery of the needle electrode 20, the molten body M on the surface of the needle electrode 20 is actively oxidized to form an oxide film Ox on an outermost surface as illustrated in FIG. 4. Then, the sputtering particles 24s having flown onto the needle electrode 20 are trapped by the oxide film Ox without reaching the inside molten body M. Therefore, it is considered that the sputtering particles 24s do not inhibit the flow of the molten body M moving toward the distal end 20t of the needle electrode 20. As a result, the emission of the ion beam IB becomes stable.

The oxide film Ox at the distal end 20t of the needle electrode 20 is thin, and the voltage applied to the extraction electrode 22 is concentrated at the distal end 20t. Therefore, it is considered that the molten body M at the distal end 20t easily breaks the oxide film Ox to become the ion beam IB.

As is understood from the foregoing, when the amount of the oxidizing gas to be introduced is excessively small, the sputtering particles 24s adhere to the needle electrode 20, to thereby destabilize the emission of the ion beam IB.

Meanwhile, when the amount of the oxidizing gas to be introduced is excessively large, the oxide film Ox at the distal end 20t of the needle electrode 20 becomes thick, to thereby destabilize the emission of the ion beam IB.

The amount of the oxidizing gas to be introduced into the vacuum chamber 30 varies depending on the exhaust speed of the exhaust system 46 and the ion pump 45 and the volume of the vacuum chamber 30. Therefore, it is appropriate to determine an appropriate range of the amount of the oxidizing gas to be introduced so that the actual emission of an ion beam is stabilized in each apparatus.

As illustrated in FIG. 1, the liquid metal ion source 50 may further include an oxidizing gas introduction control unit 48 configured to introduce the oxidizing gas into the vacuum chamber 30 only when a voltage is applied between the needle electrode 20 and the extraction electrode 22.

The oxidizing gas introduction control unit 48 is formed of a computer, such as a microcomputer. For example, the oxidizing gas introduction control unit 48 can be configured to monitor a voltage between the needle electrode 20 and the extraction electrode 22, and to open the flow rate adjusting portion 42 at an appropriate opening degree when a voltage is applied between the needle electrode 20 and the extraction electrode 22, or close the flow rate adjusting portion 42 when detecting that a voltage between the needle electrode 20 and the extraction electrode 22 is zero.

The effect of the oxidizing gas is exhibited when a voltage is applied between the needle electrode 20 and the extraction electrode 22, and the molten body M flows on the surface of the needle electrode 20. Thus, with the foregoing, wasteful introduction of the oxidizing gas is suppressed when a voltage between the needle electrode 20 and the extraction electrode 22 is zero, with the result that the usage amount of the oxidizing gas can be reduced.

The introduced gas adsorbs to an inner surface of the vacuum chamber 30, and is gradually released into the vacuum chamber 30. With this, even when the gas is caused to adsorb to the inner surface of the vacuum chamber 30 when a high voltage is not applied, and the gas is supplied therefrom, the same effect is obtained.

Next, a focused ion beam apparatus 100B including a liquid metal ion source 50B according to a second embodiment of the present invention is described with reference to FIG. 5.

The focused ion beam apparatus 100B including the liquid metal ion source 50B according to the second embodiment has the same configuration as that of the first embodiment except that a communication flow passage of the oxidizing gas introducing portion 40 to the vacuum chamber 30 is different. The same components as those of the first embodiment are denoted by the same reference symbols as those in FIG. 1, and the description thereof is omitted.

Specifically, in the second embodiment, the flow passage of the exhaust system 46 and the flow passage of the oxidizing gas introducing portion 40 are joined in a flow passage F3. Further, the flow passage F3 and the flow passage of the ion pump 45 are joined to communicate to the vacuum chamber 30 through one flow passage F4. The operations of the exhaust system 46 and the ion pump 45 are the same as those in the first embodiment.

The flow passage F4 is formed at a position where at least part thereof is opposed to the needle electrode 20 in the horizontal direction.

In the second embodiment, it is not required to form the flow passage F2 (FIG. 1) for the oxidizing gas introducing portion 40. Therefore, there is an advantage in that, when the oxidizing gas introducing portion is to be installed later in the existing liquid metal ion source, the degree of freedom for the installation is increased.

Figure 5:
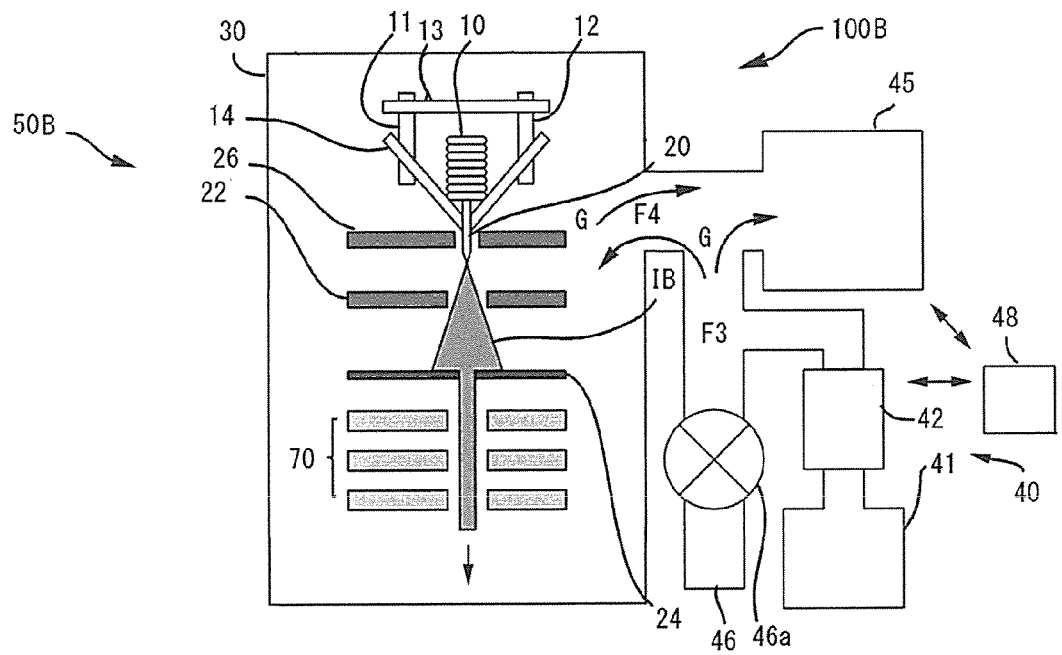
FIG. 5 is a diagram for illustrating an overall configuration of a focused ion beam apparatus including a liquid metal ion source according to a second embodiment of the present invention.

Meanwhile, as illustrated in FIG. 5, in the second embodiment, the oxidizing gas G introduced from the oxidizing gas introducing portion 40 through the flow passage F3 is branched to an ion pump 45 side in addition to flowing to a vacuum chamber 30 side through the flow passage F4. Thus, when it is assumed that the oxidizing gas G is divided equally in terms of a molecular flow, it is considered that the introduction amount of the oxidizing gas G is required to be about twice the amount in the first embodiment in order for the oxidizing gas G to act effectively in the oxidation reaction.

The oxidizing gas G having entered the vacuum chamber 30 is also finally discharged by the ion pump 45, and hence the vacuum degree is decreased as compared to the first embodiment.

Also in the second embodiment, through introduction of the oxidizing gas into the periphery of the needle electrode 20, the molten body M on the surface of the needle electrode 20 is actively oxidized, and the emission of the ion beam IB becomes stable.

The present invention is not limited to the above-mentioned embodiments, and needless to say, the present invention encompasses various modifications and equivalents included in the spirit and scope of the present invention.

In the first embodiment, the flow passages F1 and F2 may not be opposed to each other in the horizontal direction (direction perpendicular to the irradiation direction of the ion beam IB).

In addition, the flow passages F1 and F2 in the first embodiment and the flow passage F4 in the second embodiment may not be formed at positions where the flow passages F1 and F2 and the flow passage F4 are opposed to the needle electrode 20 (in the direction perpendicular to the irradiation direction of the ion beam IB).

Examples

The stability of the emission of an ion beam based on the presence or absence of the introduction of the oxidizing gas into the vacuum chamber 30 was evaluated through use of each of the liquid metal ion sources (focused ion beam apparatus) illustrated in FIG. 1 and FIG. 5.

The exhaust system 46 is separated from a system after the exhaust system 46 evacuates the vacuum chamber 30 to a vacuum degree at which the ion pump 45 is operated. The exhaust ability of the ion pump 45 was set to 30 L/mm, and the volume of the vacuum chamber 30 was set to 2 L.

Figure 8:
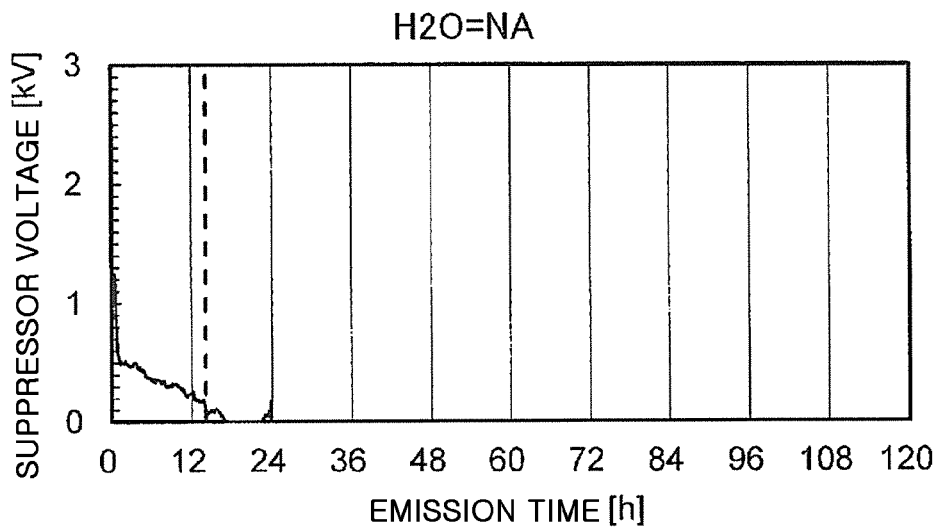
FIG. 8 is a graph showing a change over time of a voltage of a suppressor electrode when the oxidizing gas is not introduced into a vacuum chamber in the liquid metal ion source according to the first embodiment.

The stability of the emission of an ion beam was evaluated based on the fluctuation in voltage applied to the suppressor electrode 26. As shown in FIG. 8 described later, when it becomes difficult to emit an ion beam, the voltage of the suppressor electrode 26 is decreased.

Specifically, the case in which the voltage of the suppressor electrode 26 was kept at 0.1 kv or more for 50 hours or more after the beginning of the application of a voltage between the needle electrode 20 and the extraction electrode 22 was evaluated as satisfactory (indicated by Symbol "○") (the emission of an ion beam is stable), and the case in which the voltage of the suppressor electrode 26 was decreased to less than 0.1 kv in less than 50 hours from the beginning was evaluated as poor (indicated by Symbol "x") (the emission of an ion beam is unstable).

The obtained results are shown in FIG. 6 to FIG. 9.

As shown in FIG. 6, it was found that, in the case of the liquid metal ion source 50 according to the first embodiment, the emission of an ion beam became stable when the vacuum degree in a state in which the oxidizing gas was introduced into the vacuum chamber 30 fell within a range of from $5.0\times10^{-6}$ Pa to $1.5\times10^{-5}$ Pa.

Meanwhile, as shown in FIG. 7, it was found that, in the case of the liquid metal ion source 50 according to the second embodiment, the emission of an ion beam became stable when the vacuum degree in a state in which the oxidizing gas was introduced into the vacuum chamber 30 fell within a range of from $1.0\times10^{-5}$ Pa to $3.0\times10^{-5}$ Pa. The reason why the vacuum degree of the liquid metal ion source 50 according to the second embodiment is lower (the introduction amount of the oxidizing gas is increased) is considered as described below. Part of the oxidizing gas is discharged by the exhaust system 46 and cannot reach the vacuum chamber 30 as described above.

FIG. 8 is a graph showing a change over time of a voltage of the suppressor electrode 26 when the oxidizing gas is not introduced into the vacuum chamber 30 in the liquid metal ion source 50 according to the first embodiment. The voltage of the suppressor electrode 26 was decreased to less than 0.1 kv in 14 hours from the beginning.

Figure 9:
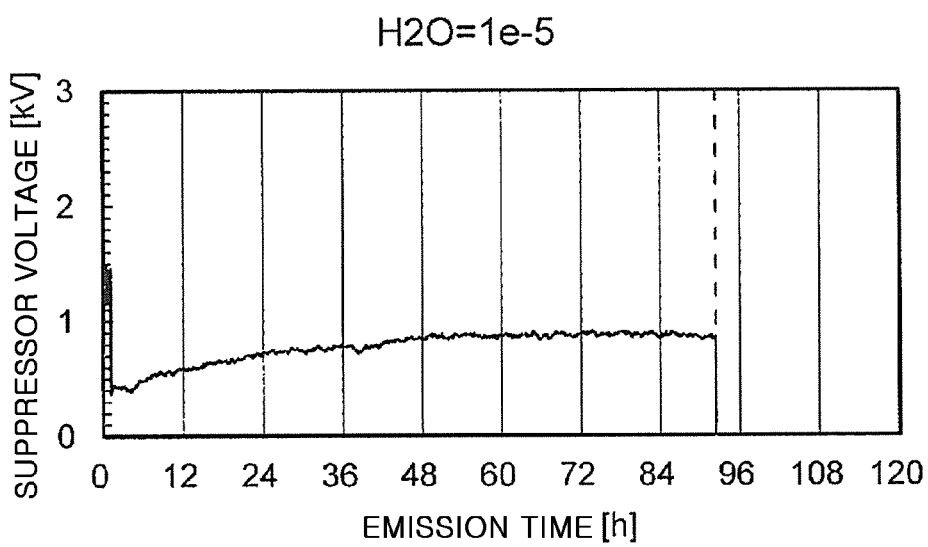
FIG. 9 is a graph showing a change over time of a voltage of the suppressor electrode when the oxidizing gas is introduced into the vacuum chamber at a vacuum degree of $1.0 \times 10^{-5}$ Pa in the liquid metal ion source according to the first embodiment.

FIG. 9 is a graph showing a change over time of a voltage of the suppressor electrode 26 when the oxidizing gas is introduced into the vacuum chamber 30 at a vacuum degree of $1.0 \times 10^{-5}$ Pa in the liquid metal ion source 50 according to the first embodiment. The voltage of the suppressor electrode 26 was kept at 0.1 kv or more for 50 hours or more from the beginning.

According to at least one embodiment of the present invention, the liquid metal ion source capable of stably emitting an ion beam for a long period of time and the focused ion beam apparatus are obtained.

What is claimed is:

1. A liquid metal ion source, comprising:
   a reservoir configured to hold an ion material forming a liquid metal;
   a needle electrode having a surface to be covered with the ion material supplied from the reservoir;
   an extraction electrode configured to cause an ion of the ion material to be emitted from a distal end of the needle electrode;
   a beam diaphragm, which is arranged on a downstream side of the extraction electrode, and is configured to limit a beam diameter of the ion; and
   a vacuum chamber configured to accommodate and hold the reservoir, the needle electrode, the extraction electrode, and the beam diaphragm in vacuum,
   wherein the liquid metal ion source further comprises an oxidizing gas introducing portion, and
   wherein the oxidizing gas introducing portion communicates to the vacuum chamber, and is configured to introduce an oxidizing gas into a periphery of the needle electrode.

2. The liquid metal ion source according to claim 1, wherein the oxidizing gas is water vapor.

3. The liquid metal ion source according to claim 1, further comprising a final exhaust system configured to evacuate the vacuum chamber to a target vacuum degree, wherein the final exhaust system and the oxidizing gas introducing portion communicate to the vacuum chamber through separate flow passages.

4. The liquid metal ion source according to claim 3, wherein the vacuum chamber has a vacuum degree of from $5.0 \times 10^{-6}$ Pa to $1.5 \times 10^{-5}$ Pa in a state of having the oxidizing gas introduced thereinto.

5. The liquid metal ion source according to claim 3, wherein at least part of a flow passage of the final exhaust system and at least part of a flow passage of the oxidizing gas introducing portion are opposed to each other in a direction perpendicular to an irradiation direction of a beam of the ion.

6. The liquid metal ion source according to claim 3, wherein at least part of a flow passage of the final exhaust system and at least part of a flow passage of the oxidizing gas introducing portion are each opposed to the needle electrode in a direction perpendicular to an irradiation direction of a beam of the ion.

7. The liquid metal ion source according to claim 1, further comprising a final exhaust system configured to evacuate the vacuum chamber to a target vacuum degree, wherein the final exhaust system and the oxidizing gas introducing portion communicate to the vacuum chamber through a same flow passage.

8. The liquid metal ion source according to claim 7, wherein the vacuum chamber has a vacuum degree of from $1.0 \times 10^{-5}$ Pa to $3.0 \times 10^{-5}$ Pa in a state of having the oxidizing gas introduced thereinto.

9. The liquid metal ion source according to claim 1, further comprising an oxidizing gas introduction control unit configured to introduce the oxidizing gas into the vacuum chamber only when a voltage is applied between the needle electrode and the extraction electrode.

10. A focused ion beam apparatus, comprising the liquid metal ion source of claim 1.

* * * * *